(12) United States Patent
Basaran et al.

(10) Patent No.: US 9,413,326 B2
(45) Date of Patent: Aug. 9, 2016

(54) SECOND-ORDER FILTER WITH NOTCH FOR USE IN RECEIVERS TO EFFECTIVELY SUPPRESS THE TRANSMITTER BLOCKERS

(71) Applicant: Intel Deutschland GmbH, Neubiberg (DE)

(72) Inventors: Umut Basaran, Unterhaching (DE); Josef Schmal, Aying (DE); Stefan Herzinger, Sauerlach (DE); Herbert Stockinger, Schliersee (DE); Volker Thomas, Gilching (DE)

(73) Assignee: INTEL DEUTSCHLAND GMBH, Neubiberg (DE)

( * ) Notice: Subject to any disclaimer, the term of this patent is extended or adjusted under 35 U.S.C. 154(b) by 0 days.

(21) Appl. No.: 14/793,129

(22) Filed: Jul. 7, 2015

(65) Prior Publication Data

US 2015/0318836 A1 Nov. 5, 2015

Related U.S. Application Data

(63) Continuation of application No. 13/405,673, filed on Feb. 27, 2012, now Pat. No. 9,112,476.

(51) Int. Cl.
*H04B 1/38* (2015.01)
*H03H 7/01* (2006.01)
(Continued)

(52) U.S. Cl.
CPC .............. *H03H 7/0153* (2013.01); *H03H 7/06* (2013.01); *H03H 7/12* (2013.01); *H03H 11/1217* (2013.01); *H04B 1/525* (2013.01); *H03H 2007/013* (2013.01)

(58) Field of Classification Search
CPC ... H03H 7/0153; H03H 7/06; H03H 11/1217; H03H 7/12; H03H 2007/013; H04B 1/525

USPC .......................................................... 375/219
See application file for complete search history.

(56) References Cited

U.S. PATENT DOCUMENTS

| 8,036,623 | B2 | 10/2011 | Chang et al. |
| 9,112,476 | B2 * | 8/2015 | Basaran .................. H03H 7/12 |

(Continued)

FOREIGN PATENT DOCUMENTS

| CN | 1339198 A | 3/2002 |
| CN | 102132497 A | 7/2011 |

OTHER PUBLICATIONS

First Office Action Dated Sep. 1, 2014 CN Patent Application No. 201310061256.9.

(Continued)

*Primary Examiner* — Dhaval Patel
(74) *Attorney, Agent, or Firm* — Eschweiler & Associates, LLC

(57) ABSTRACT

The disclosed invention relates to a transceiver system comprising a notch filter element configured to suppress transmitter blockers (i.e., transmitter interferer signals) within a reception path. In some embodiments, the transceiver front-end comprises a differential reception path, having a first differential branch and a second differential branch, configured to provide an RF differential input signal having a transmitter blocker to a transimpedance amplifier, comprising a first-order active filter and a notch filter element. The notch filter element comprises a stop band corresponding to a frequency of a transmitted signal, such that the notch filter element suppresses the transmitted blocker without degrading the signal quality of the received differential input signal.

15 Claims, 9 Drawing Sheets

(51) Int. Cl.
　　*H03H 7/06* (2006.01)
　　*H03H 7/12* (2006.01)
　　*H03H 11/12* (2006.01)
　　*H04B 1/525* (2015.01)

(56) References Cited

U.S. PATENT DOCUMENTS

| | | |
|---|---|---|
| 2008/0160916 A1 | 7/2008 | Jagger et al. |
| 2009/0212855 A1 | 8/2009 | Mitchell |
| 2011/0221378 A1 | 9/2011 | Tazawa et al. |
| 2011/0255628 A1 | 10/2011 | Woleben et al. |
| 2012/0326904 A1 | 12/2012 | Jensen et al. |
| 2013/0113409 A1 | 5/2013 | Tazawa et al. |
| 2013/0149983 A1 | 6/2013 | Fahim et al. |

OTHER PUBLICATIONS

Bormann, D. et al. "A Notch Filter Alignment Circuit for Wireless Communication FDD Systems" Proceedings of Asia-Pacific Microwave Conference 2010.

Burr Brown. "Precision Switched Integratortransimpedance Amplifier." Jun. 1996. 14 pages.

\* cited by examiner

SECOND-ORDER FILTER WITH NOTCH FOR USE IN RECEIVERS TO EFFECTIVELY SUPPRESS THE TRANSMITTER BLOCKERS

CROSS REFERENCE TO RELATED APPLICATIONS

This application is a continuation of U.S. application Ser. No. 13/405,673 filed on Feb. 27, 2012, and incorporated herein by reference in its entirety.

BACKGROUND

Many modern wireless communication devices (e.g., cell phones, PDAs, etc.) comprise transceivers configured to both transmit data and to receive data over radio frequencies. FIG. 1 illustrates a wireless communication transceiver 100 comprising a duplexer 104 configured to couple a transmitter section 106 and receiver section 108 to an antenna 102. Receiver section 108 comprises an amplifier stage 110, a mixer 112, and a transimpedance amplifier 114. Amplifier stage 110 is configured to receive a radio frequency (RF) input signal as a voltage and to convert the received RF input signal to a current. The current is provided to the mixer 112, which down-converts the RF signal to an intermediate frequency (IF) signal. The IF signal is provided to a transimpedance amplifier 114, which converts the current into a voltage and additionally filters unwanted interferer signals.

To achieve high data rates, transceiver 100 may be configured to operate in full-duplex mode, wherein both transmitter section 106 and receiver section 108 use antenna 102 at the same time. During full-duplex mode operation, transmitter section 106 typically uses one carrier frequency while receiver section 108 uses another carrier frequency. Despite using different frequencies, intermodulation distortion may arise during operation of transceiver 100. One such source of intermodulation distortion occurs when a transmitted signal leaks from transmitter section 106 to receiver section 108, generating a transmitter blocker (i.e., a transmitter interferer signal). Once intermodulation distortion appears within receiver section 108, there is no way of distinguishing it from the desired signal, and sensitivity of the transceiver 100 is degraded.

DRAWINGS

Figure 7A:
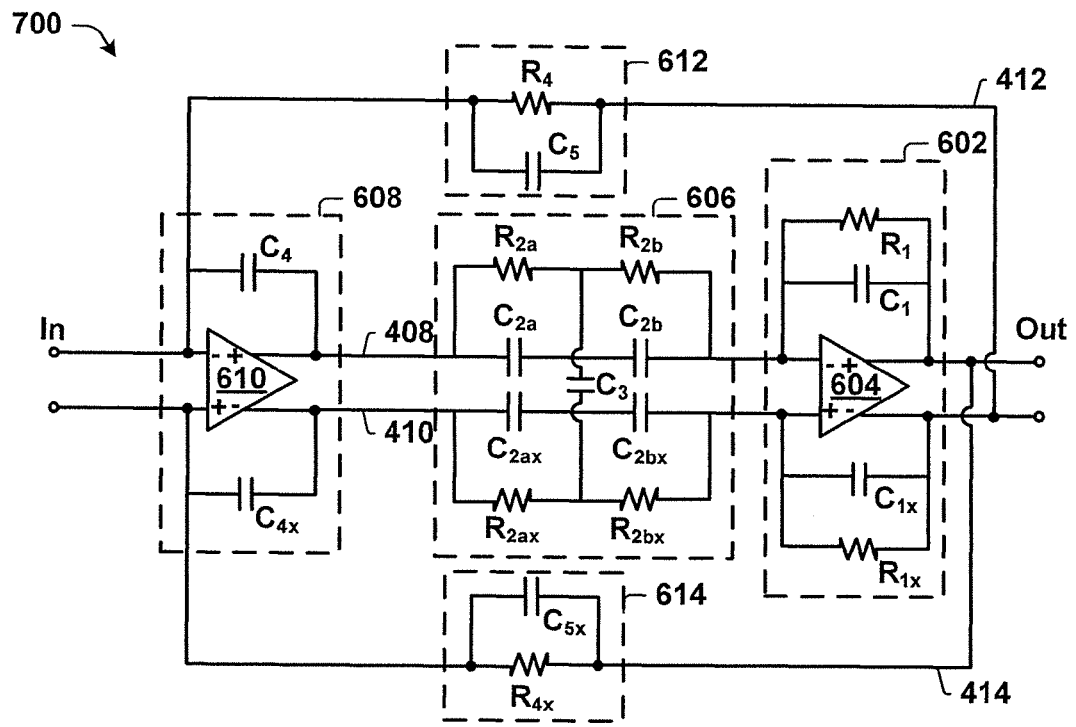
Figure 7B:
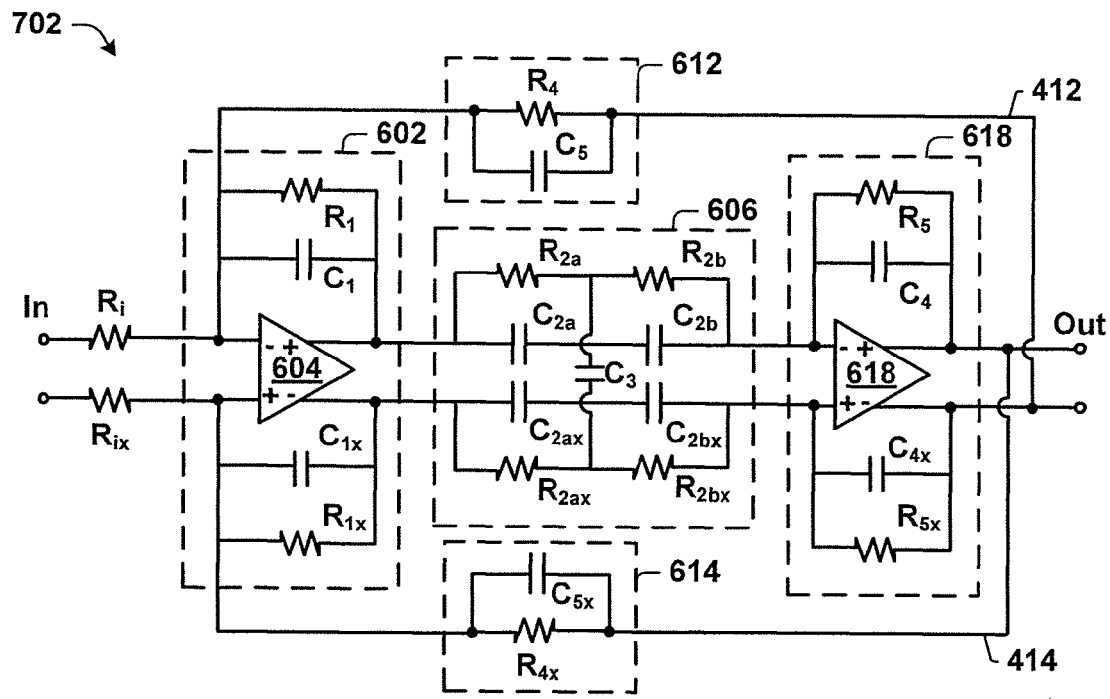

FIGS. 7a-b illustrate schematic diagrams of some embodiments of a disclosed transimpedance amplifier comprising having components configured in different orders along a differential reception path.

Figure 8A:
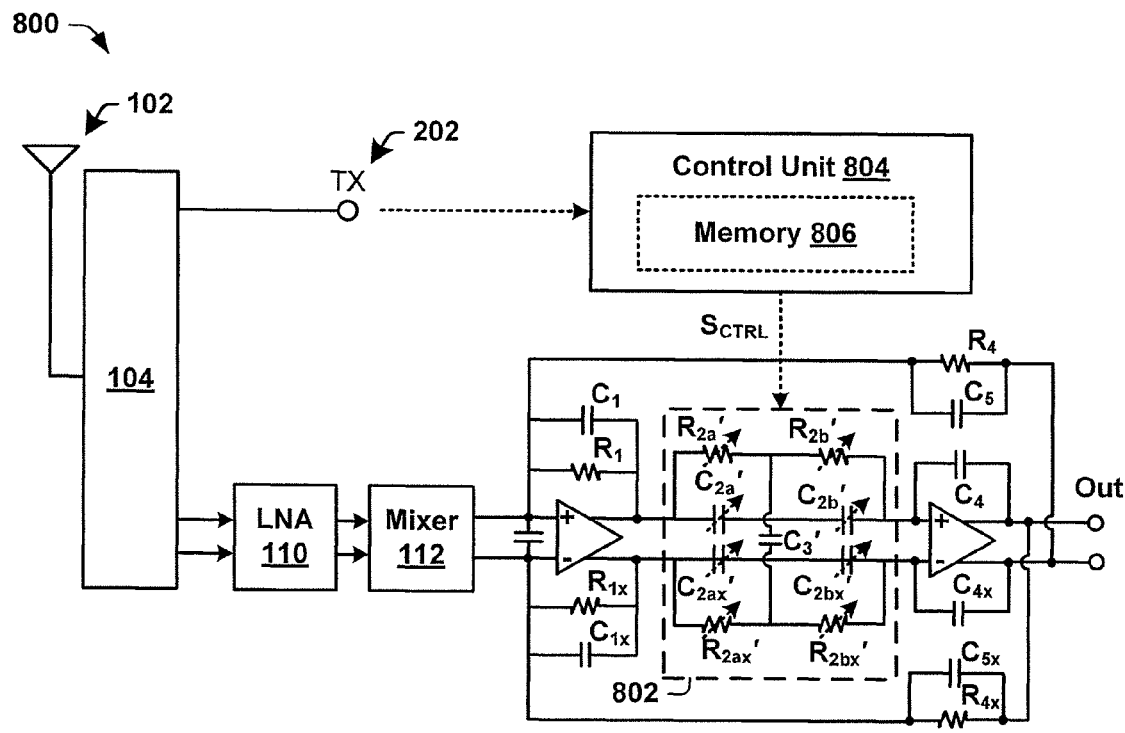

FIG. 8a illustrates a schematic diagram of some embodiments of a disclosed transceiver system having a tunable notch filter element.

Figure 8B:
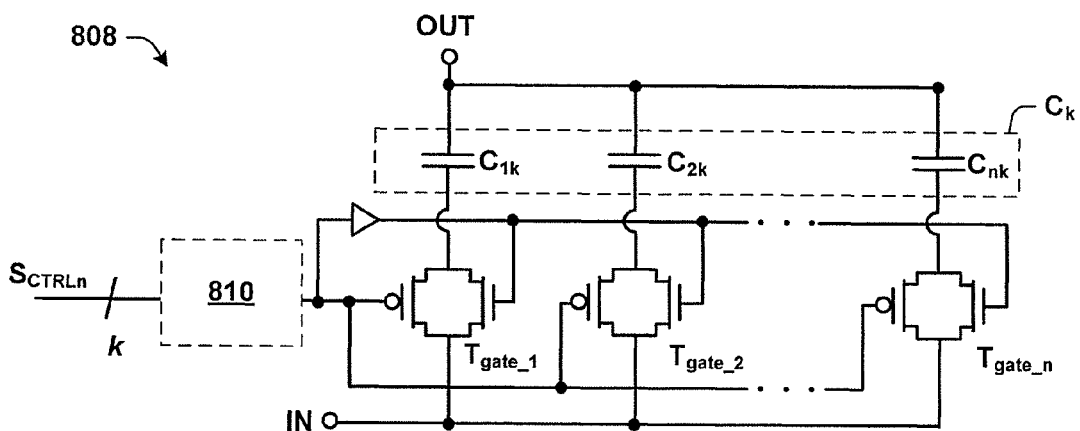

FIG. 8b illustrates a schematic diagram of an exemplary embodiment of a variable capacitor configuration.

Figure 9:
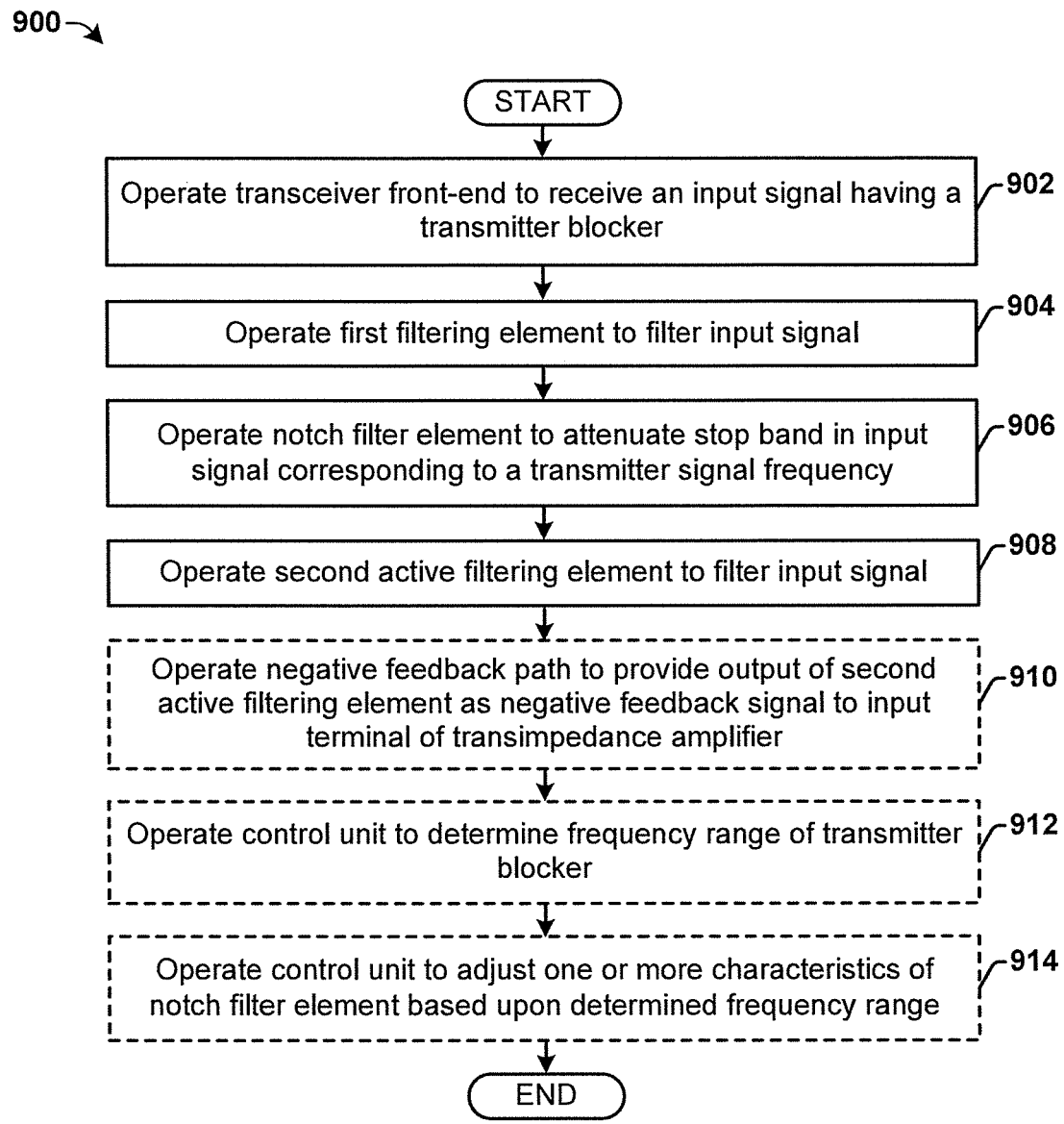

FIG. 9 is a flow diagram of an exemplary method for suppressing transmitter blockers within a reception path.

Figure 10:
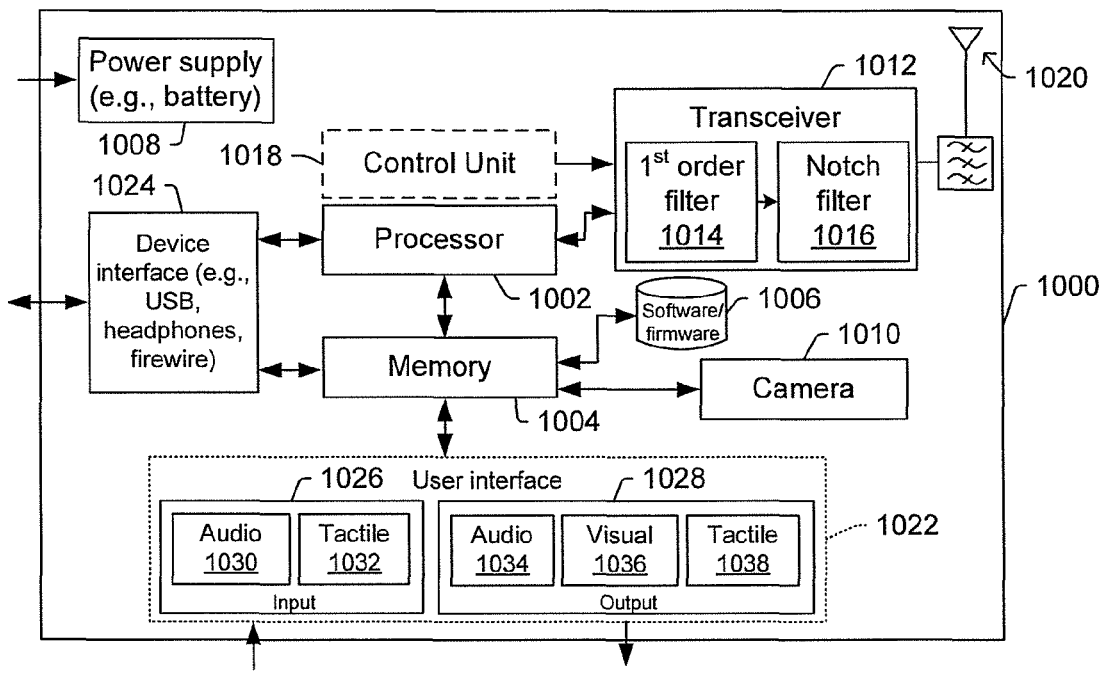

FIG. 10 illustrates an example of a mobile communication device, such as a mobile handset, in accordance with the disclosure.

Figure 11:
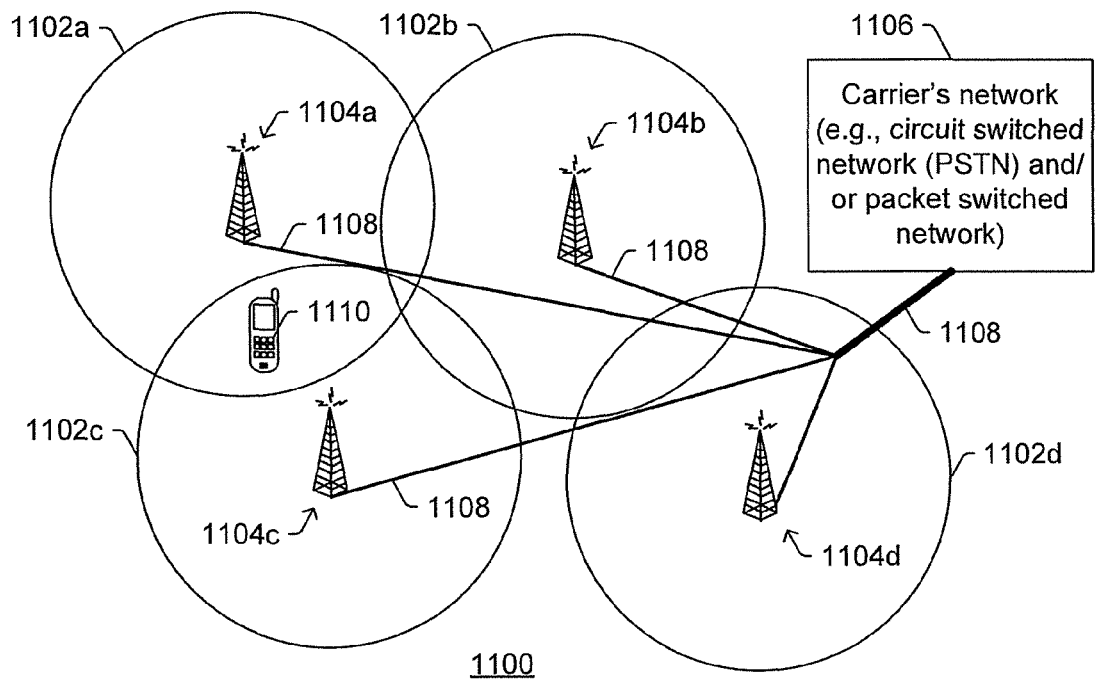

FIG. 11 illustrates an example of a wireless communication network in accordance with the disclosure.

DETAILED DESCRIPTION

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details.

The present disclosure relates to a transceiver front-end comprising a notch filter element configured to suppress transmitter blockers (i.e., transmitter interferer signals) within a reception path. In some embodiments, the transceiver front-end comprises a differential reception path, having a first differential branch and a second differential branch. The differential reception path is configured to provide an RF differential input signal having a transmitter blocker to a transimpedance amplifier comprising a first-order active filter and a notch filter element. The notch filter element comprises a stop band corresponding to a frequency of the transmitter blocker, such that the notch filter element attenuates the transmitter blocker without degrading the signal quality of the received differential input signal.

Figure 1:
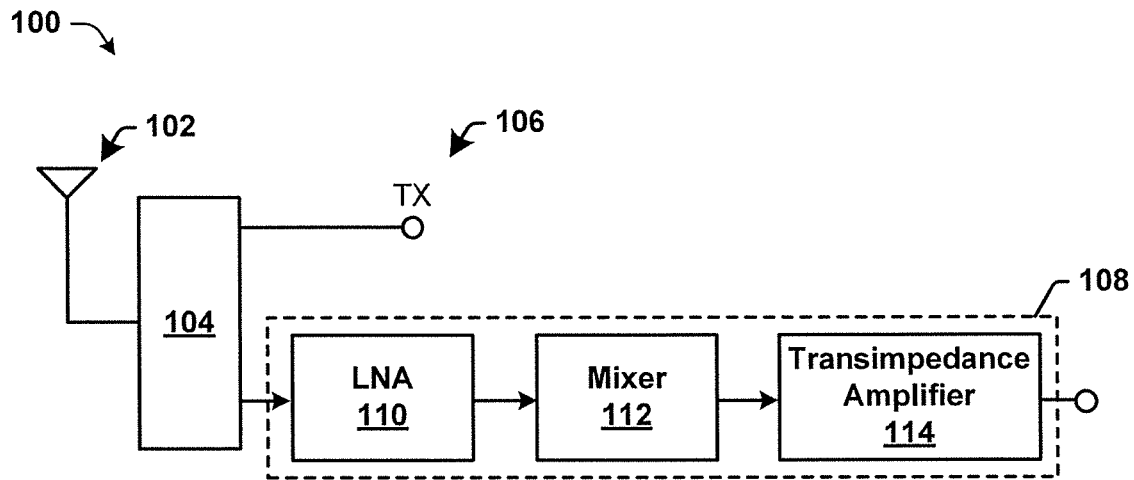
FIG. 1 illustrates a block diagram of a conventional transceiver system.
Figure 2:
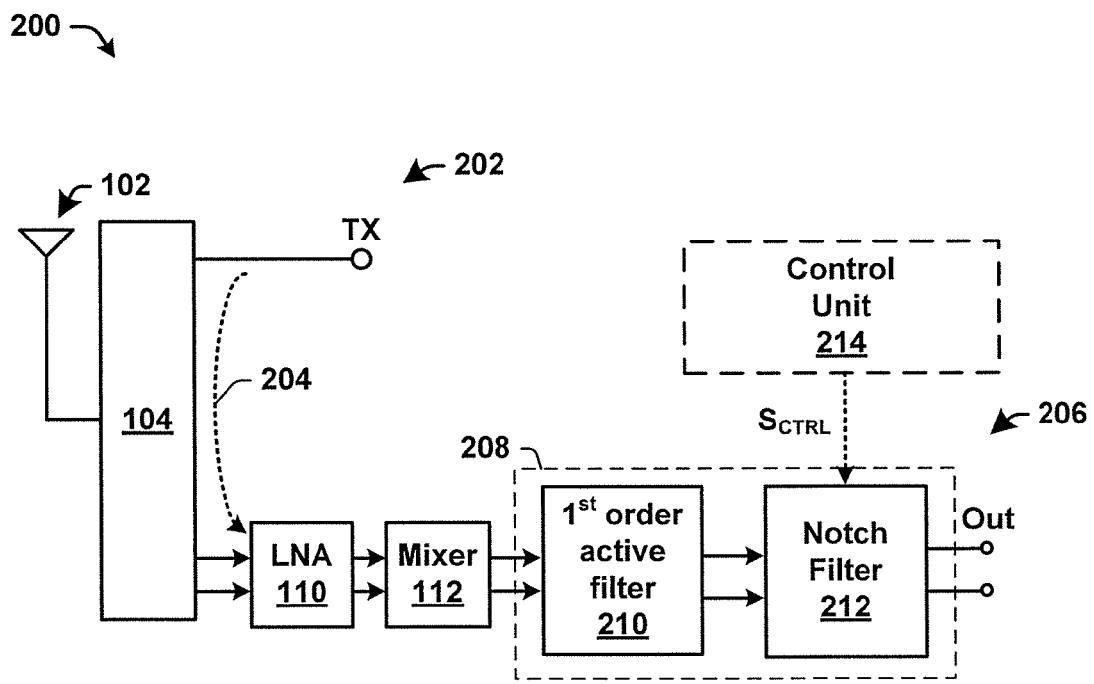
FIG. 2 illustrates a block diagram of some embodiments of a disclosed transceiver system having a transimpedance amplifier comprising a notch filter element configured to suppress transmitter blockers within a reception path.

FIG. 2 illustrates a block diagram of some embodiments of a disclosed transceiver system 200 having a transimpedance amplifier 208 comprising a notch filter element 212 configured to attenuate transmitter blockers (i.e., transmitter interferer signals from transmission path 202) within a reception path 206. Although the transceiver circuits shown and described herein are illustrated as differential or single ended circuits, it will be appreciated that the apparatus provided herein are not limited to such circuits. Instead, the method and apparatus provided herein may be applied to both differential and single ended circuits.

Transceiver system 200 comprises a transmission path 202 and a reception path 206. Transmission path 202 is configured to provide a signal for transmission (a transmitted signal) to an antenna 102 by way of a duplexer 104. Duplexer 104 is further configured to receive an RF input signal from antenna 102. The RF input signal is provided to reception path 206 as an RF input signal. Transmitter blockers 204 corresponding to the transmission signals frequency may leak from the transmission path 202 through the duplexer 104 to the reception path 206.

Reception path 206 includes a low noise amplifier (LNA) 110, a mixer 112, and a transimpedance amplifier 208. LNA 110 is configured to receive the RF input signal as a voltage and to convert it to a current that is provided to the mixer 112, which demodulates the received RF input signal to generate an input signal comprising a received current. Transimpedance amplifier 208 comprises a multiple feedback filter having a first-order filter element 210 and a notch filter element 212. The transimpedance amplifier 208 is configured to receive the received current from mixer 112, to filter the received current, and to convert the received current to a voltage. In some embodiments, first-order filter element 210 may be located downstream of notch filter element 212, while in other embodiments, first-order filter element 210 may be located upstream of notch filter element 212.

As shown in FIG. 2, first-order filter element 210 is configured to receive the received current from mixer 112. First-order filter element 210 filters the received current to reduce noise within the received input signal. In some embodiments, first-order filter element 210 may comprise an active low-pass filter, for example. The filtered current is output from first-order filter element 210 to notch filter element 212, which is configured to attenuate signals within a stop band frequency corresponding to a frequency of the transmitted signal. By attenuating signals corresponding to the frequency of the transmitted signal, while passing other frequencies, transmitter blockers 204 that have leaked from the transmission path 202 to the reception path 206 are effectively removed from reception path 206, without degrading the signal quality of the input signal received from antenna 102.

In some embodiments, notch filter element 212 may comprise a tunable notch filter having an adjustable stop band frequency. A control unit 214 may be configured to generate a control signal $S_{CTRL}$ that is provided to the notch filter element 212 to control one or more characteristics of the stop band frequency of the tunable notch filter. In various embodiments, the one or more characteristics may comprise a stop band center frequency and/or a stop band frequency range. By operating control unit 214 to adjust one or more characteristics of the stop band of the tunable notch filter, the transceiver system 200 can be actively adjusted to suppress transmitted signals over a range of transmission frequencies, thereby enabling suppression of a transmitter blocker in multiband communication systems.

It will be appreciated that by attenuating a transmitter blockers 204 that have leaked into the reception path 206, the disclosed transceiver system 200 allows for duplexer 104 to have a relatively low isolation, thereby reducing the cost of the transceiver system 200. Furthermore, the notch filter element 212 removes interference from the transmission path 202 while maintaining a low current consumption and input impedance (e.g., in contrast to conventional first order or second-order filters, which are often implemented at the cost of increasing the current consumption, the input impedance, and the transceiver complexity).

Figure 3A:
FIGS. 3a-3c illustrate graphs showing the frequency of signals along the reception path in the disclosed transimpedance amplifier circuit.
Figure 3B:
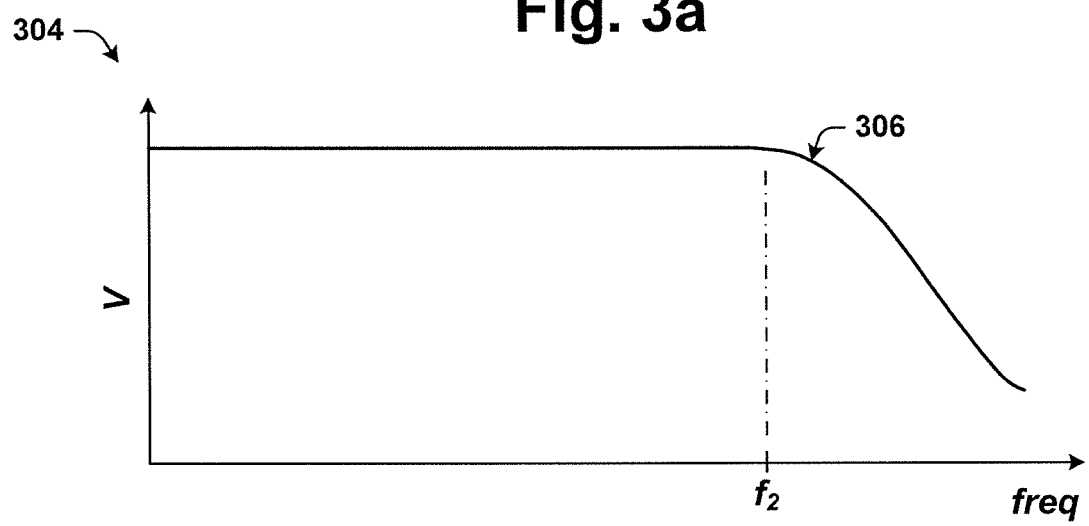
Figure 3C:
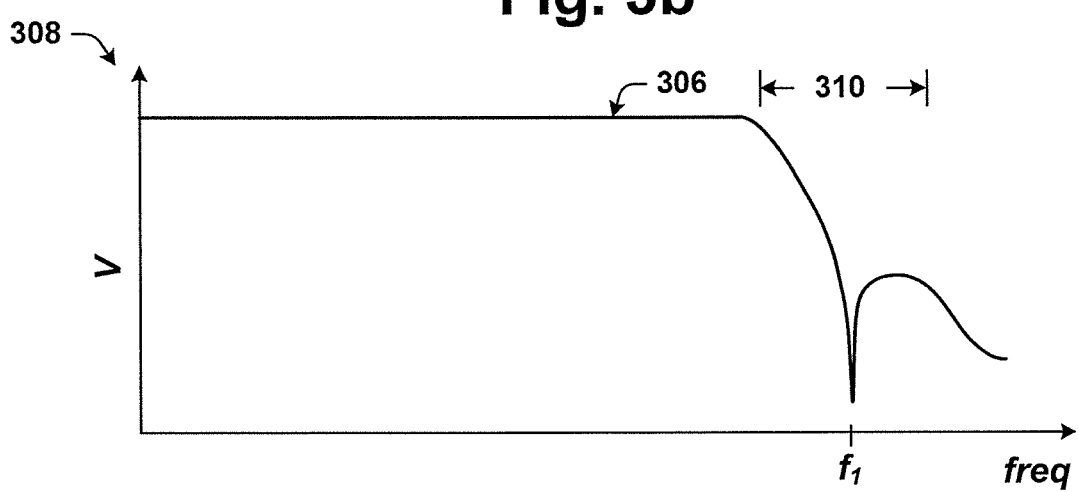

FIGS. 3a-3c illustrate graphs showing the frequency of signals in a reception path of a disclosed filter transimpedance amplifier.

FIG. 3a illustrates a graph 300 showing a transmitter blocker 302 within a reception path. The horizontal axis represents the frequency of the transmitter blocker, while the vertical axis represents the amplitude of the voltage of the transmitter blocker. As shown in graph 300, the transmitter blocker 302 has a frequency that is centered on a first frequency $f_1$. It will be appreciated that the frequency of the transmitter blocker will depend upon the frequency of a signal transmitted by a transceiver and may vary in time.

FIG. 3b illustrates a graph 304 showing a filter response 306 of a first-order active filter comprising a low-pass filter (i.e., showing the received input signal that is output from a first-order active filter). The horizontal axis represents the frequency of a received input signal, while the vertical axis represents the amplitude of the voltage of the received input signal. As shown in graph 304, the filter response 306 of a first-order active filter passes an input signal at low frequencies, while attenuating the received input signal at frequencies above a filter knee located at a frequency $f_2$.

FIG. 3c illustrates a graph 308 showing a filter response 310 of a notch filter element (i.e., showing the received input signal that is output from the transimpedance amplifier). The horizontal axis represents the frequency of a received input signal, while the vertical axis represents the amplitude of the received input signal. The notch filter element provides for a filter response 310 having a low level of attenuation away from the notch frequency $f_1$, and an increasingly large level of attenuation as the frequency moves closer to the notch frequency $f_1$. Therefore, as shown in graph 308, the input signal output from the transimpedance amplifier is attenuated around the frequency $f_1$. This attenuation suppresses the transmitter blocker (e.g., shown in FIG. 3a) without substantially degrading the signal quality of the input signal.

Figure 4:
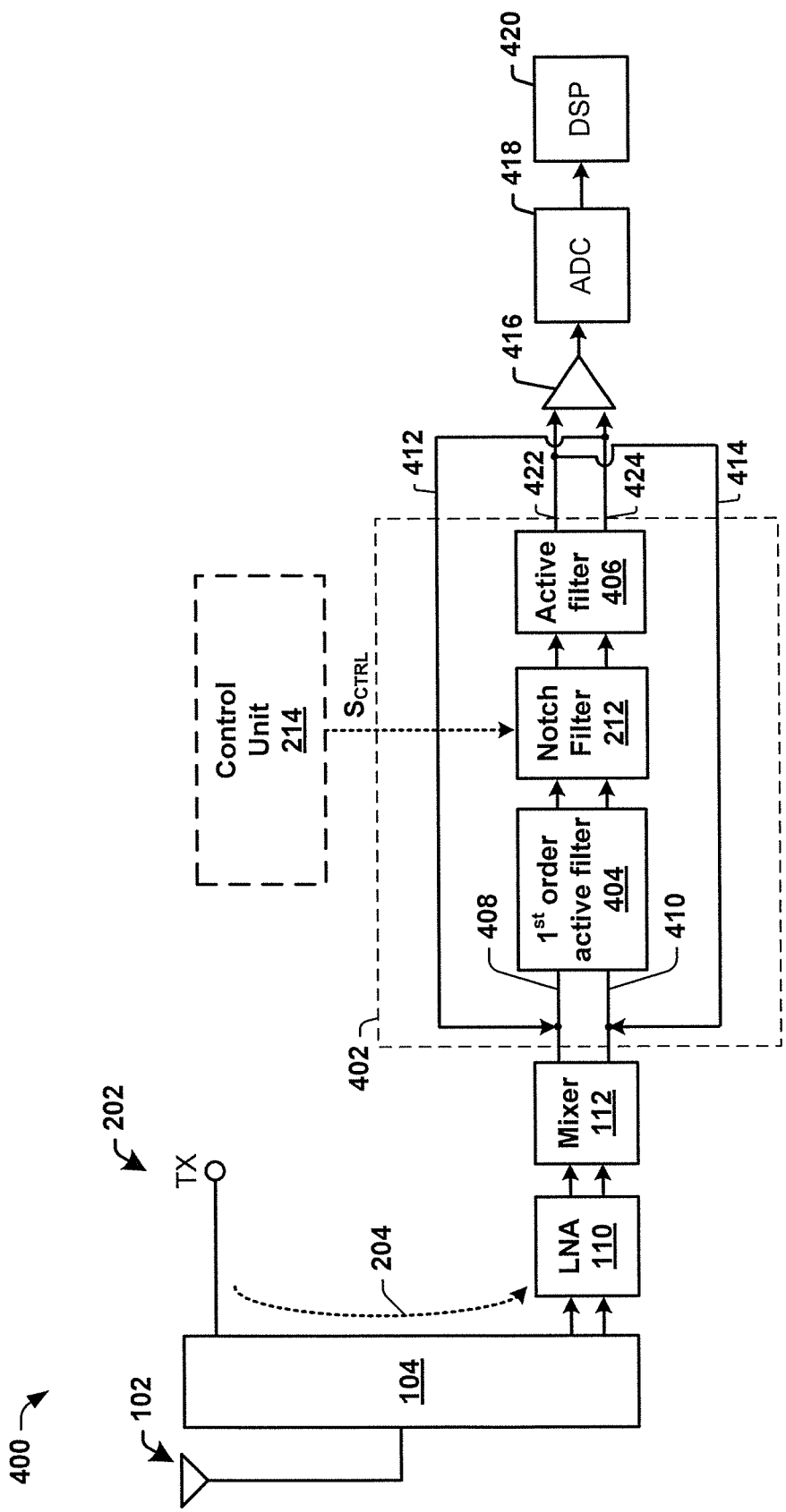
FIG. 4 illustrates a block diagram of some additional embodiments of a disclosed transceiver system having a transimpedance amplifier comprising a notch filter element.

FIG. 4 illustrates a block diagram of some embodiments of a disclosed transceiver system 400.

Transceiver system 400 comprises a differential reception path extending from duplexer 104 to a transimpedance amplifier 402. The differential reception path comprises a first differential branch 408 and a second differential branch 410. In some embodiments, first and second differential branches, 408 and 410, are configured to respectively transmit a differential N-P complementary input signal, comprising a current from duplexer 104, to transimpedance amplifier 402.

Transimpedance amplifier 402 comprises a first-order active filter 404 and a notch filter element 212, as described above, and a second active filtering element 406. In various embodiments, the second active filtering element 406 may comprise an integrator or a first-order active filter, for example. The second active filtering element 406 may be located upstream of the notch filter element 212, so as to provide a filtered signal to the notch filter element 212, or downstream of the notch filtering element 212, so as to filter the output of the notch filter element 212. As shown in FIG. 4, second active filtering element 406 is located downstream of the notch filtering element 212.

Transimpedance amplifier 402 converts the input current to an output voltage that is provided at a first output node 422 on the first differential branch 408 and a second output node 424 on the second differential branch 410. The output is provided to an amplifier element 416 configured to amplify the output of transimpedance amplifier 402. In some embodiments, the output of amplifier element 416 is provided to an analog-to-digital converter 418 configured to convert the analog input signal to a digital signal that is subsequently provided to a digital signal processor 420.

The output is further provided to a first negative feedback path 412 and a second negative feedback path 414, which are respectively configured to generate negative feedback signals that suppress the out-of-band-transmitted signals within the differential reception path, thereby improving linearity of the transimpedance amplifier 402. In some embodiments, the negative feedback signals, with an amplitude having an opposite polarity as the out-of-band transmitter signals, are provided by connecting opposite differential paths together. For example, first negative feedback path 412 extends from second output node 424 on second differential branch 410 to a node on first differential branch 408 at the input of first-order active filter 404. Second negative feedback path 414 extends from first output node 422 on first differential branch 408 to a node on second differential branch 410 at the input of first-order active filter 404.

In some embodiments, the disclosed transimpedance amplifier may comprise one or more switching elements configured to selectively bypass one or more components of the transimpedance amplifier. For example, the switching elements may be configured to bypass the notch filter element and/or one or more one or more other filtering components (e.g., the first order filter and/or the second filtering element and/or feedback paths) of the transimpedance amplifier.

Figure 5A:
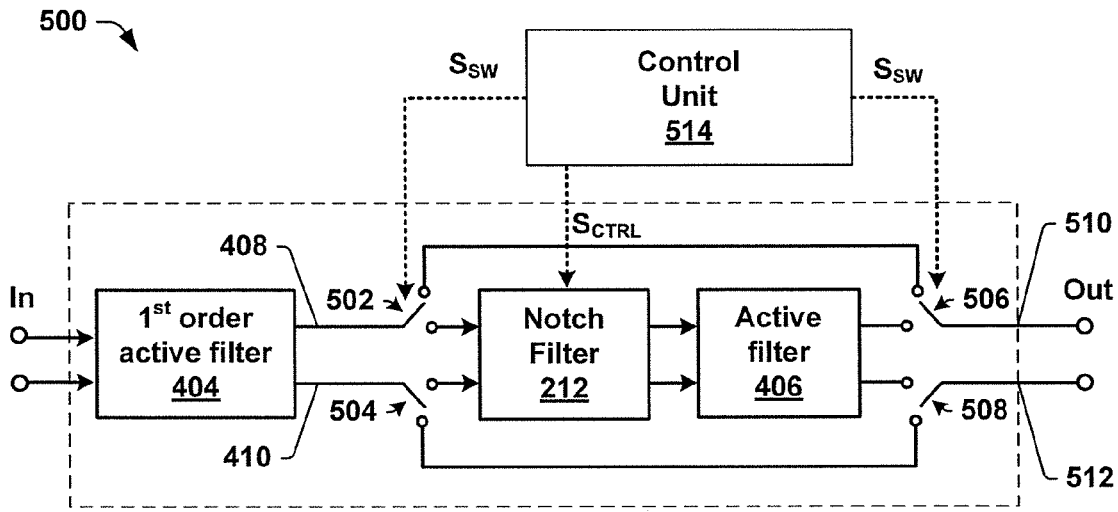
FIG. 5a illustrates a block diagram of some embodiments of a disclosed transimpedance amplifier comprising a notch filter element that can be selectively activated.

FIG. 5a illustrates a block diagram of some embodiments of a disclosed transimpedance amplifier 500 comprising a notch filter element 212 that can be selectively activated or bypassed.

As shown in FIG. 5a, the transimpedance amplifier 500 comprises first and second switching elements, 502 and 504, located upstream of notch filter element 212 and third and fourth switching elements, 506 and 508, located downstream of notch filter element 212. First and third switching elements, 502 and 506, are comprised within first differential branch 408 and are configured to selectively couple the output of first-order active filter 404 to either notch filter element 212 or to a first output node 510 of transimpedance amplifier 500. Second and fourth switching elements, 504 and 508, are comprised within second differential branch 410 and are configured to selectively couple the output of first-order active filter 404 to either notch filter element 212 or to a second output node 512 of transimpedance amplifier 500.

In some embodiments, switching elements 502-508 are configured to receive a switching control signal $S_{sw}$ from a control unit 514. By providing a switching control signal $S_{sw}$ having a first value to switching elements 502-508, notch filter element 212 and second active filtering element 406 can be selectively bypassed to get a first-order filter response if the improved performance of notch filter element 212 and second active filtering element 406 (e.g., the decreased linearity offered by the notch filter element 212) is not needed. By deactivating notch filter element 212 and second active filtering element 406, power consumption of the transimpedance amplifier 500 can be reduced. Alternatively, by providing a switching control signal $S_{sw}$ having a second value to switching elements 502-508 notch filter element 212 and integrator 406 can be selectively activated to get a second-order filter response if the improved performance of notch filter element 212 and second active filtering element 406 is needed.

In alternative embodiments, the switching elements 502-508 may be located at positions which allow the switching elements 502-508 to bypass the first-order active filter 404 and the notch filter element 212. When the first-order active filter 404 and the notch filter element 212 are bypassed, the second active filtering element 406 acts as a first-order active filter.

Figure 5B:
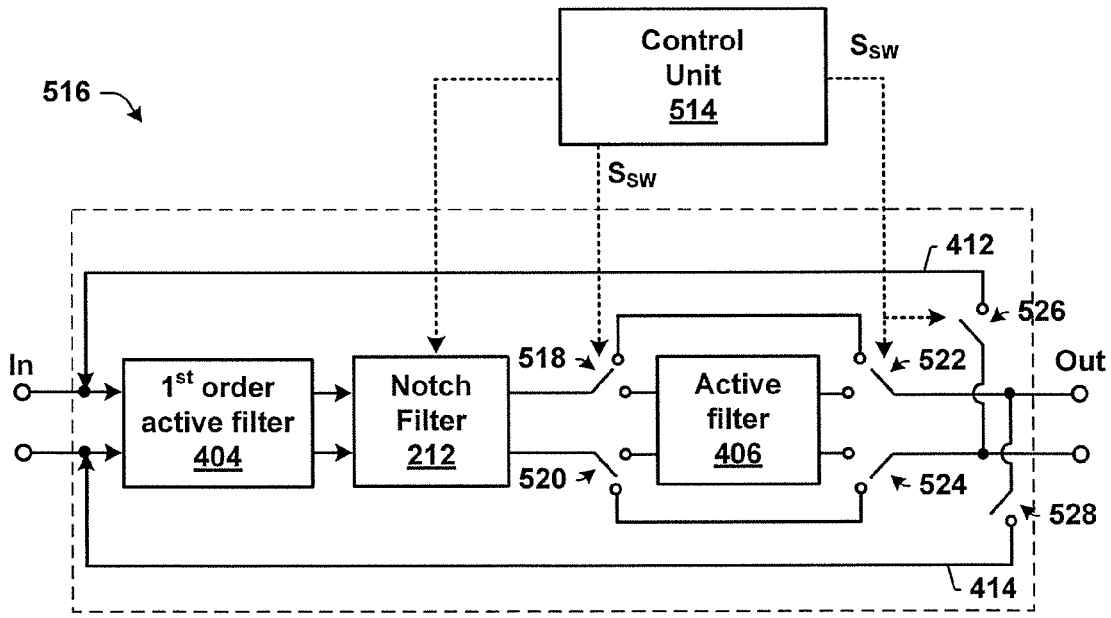
FIG. 5b illustrates a block diagram of some alternative embodiments of a disclosed transimpedance amplifier having components that may be selectively bypassed.

FIG. 5b shows a schematic diagram 516 having switching elements 518-528 located within the feedback paths 412 and 414 and the differential reception path. The switching elements 518-524 within the differential reception path can bypass the active filter 406, while switching elements 526-528 within the feedback paths 412 and 414 can be operated to bypass the feedback paths. In such a configuration the notch filter element 212 is selectively connected to the first and second output nodes 510 and 512 (e.g., a buffer or an analog-to-digital converter).

Figure 6A:
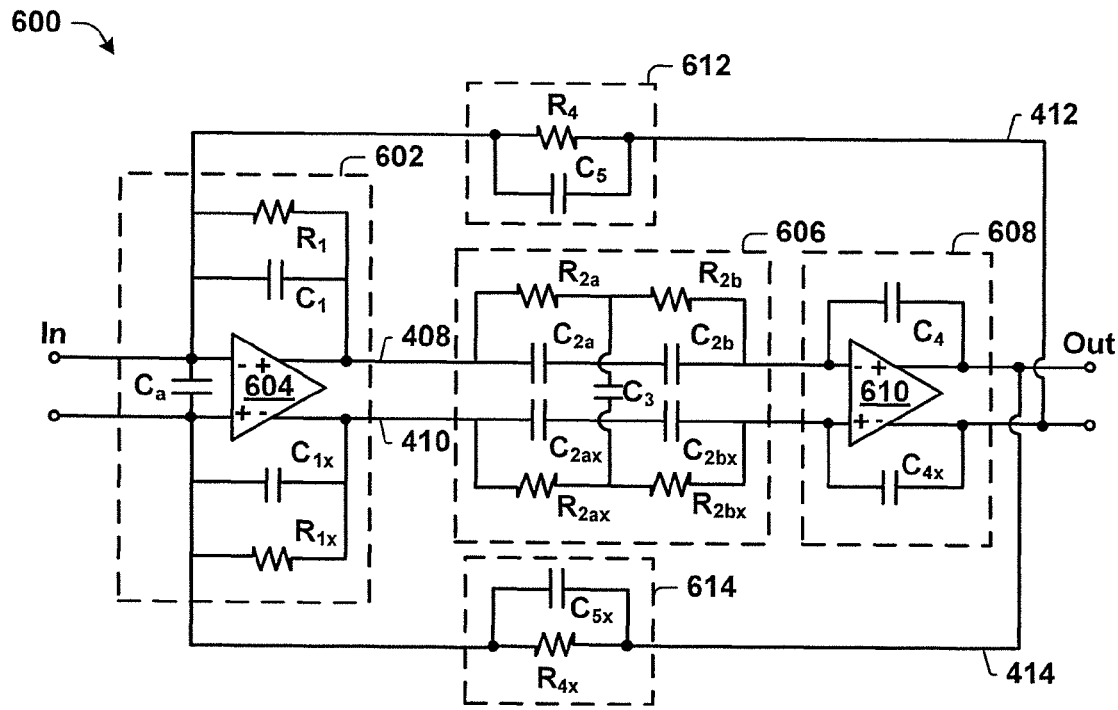
FIG. 6a illustrates a schematic diagram of some embodiments of a disclosed transimpedance amplifier comprising a notch filter element.

FIG. 6a illustrates a schematic diagram of some embodiments of a disclosed transimpedance amplifier 600 comprising a passive notch filter 606.

The transimpedance amplifier 600 comprises a first-order active filter 602. First-order active filter 602 comprises an operational amplifier 604 and an RC feedback network comprising feedback capacitors $C_1$ and $C_{1x}$ and feedback resistors $R_1$ and $R_{1x}$. A capacitor $C_a$ is configured to filter the differential input signal at very high frequencies where the open loop gain of a standard op-amp in CMOS would not be sufficient.

The output of first-order active filter 602 is provided to passive notch filter 606 comprising a capacitive element connected in parallel to a resistive element. In particular, each of the differential branches, 408 and 410, of the passive notch filter 606 comprises a first signal path comprising two resistors (e.g., $R_{2a}$ and $R_{2b}$) connected in series and a second signal path comprising two capacitors (e.g., $C_{2a}$ and $C_{2b}$) connected in series. The first and second signals paths are configured to introduce different phase shifts into the received differential input signal traveling through each signal path, resulting in a high degree of attenuation at the resonance frequency. In some embodiments the passive notch filter 606 further comprises a capacitor $C_3$ extending between the differential branches. The resonance frequency of passive notch filter 606 depends upon the values of capacitors $C_{2m}$ and/or $C_3$ and/or resistors $R_{2m}$ (where m=a, b, ax, or bx).

The output of notch filter 606 is provided to a second filtering element 608 comprising an active integrator configured to increase the gain of transimpedance amplifier 600. The active integrator comprises an operational amplifier 610 and feedback capacitors $C_4$ and $C_{4x}$ respectively extending from first and second differential output nodes of the active integrator to first and second differential input nodes of the active integrator.

In some embodiments, first and second negative feedback paths 412 and 414 comprise additional RC filtering elements 612 and 614. Each RC filtering element, 612 or 614, comprises an additional capacitor (e.g., $C_5$) and a resistor (e.g., $R_4$) connected in parallel. The additional capacitor adjusts the passive function of the filter (making it more stable), while the additional resistor defines the DC gain of transimpedance amplifier 600 (e.g., if differential input current is $I_1$, DC voltage generated by the transimpedance amplifier is equal to $I_1 \times R_4$).

Figure 6B:
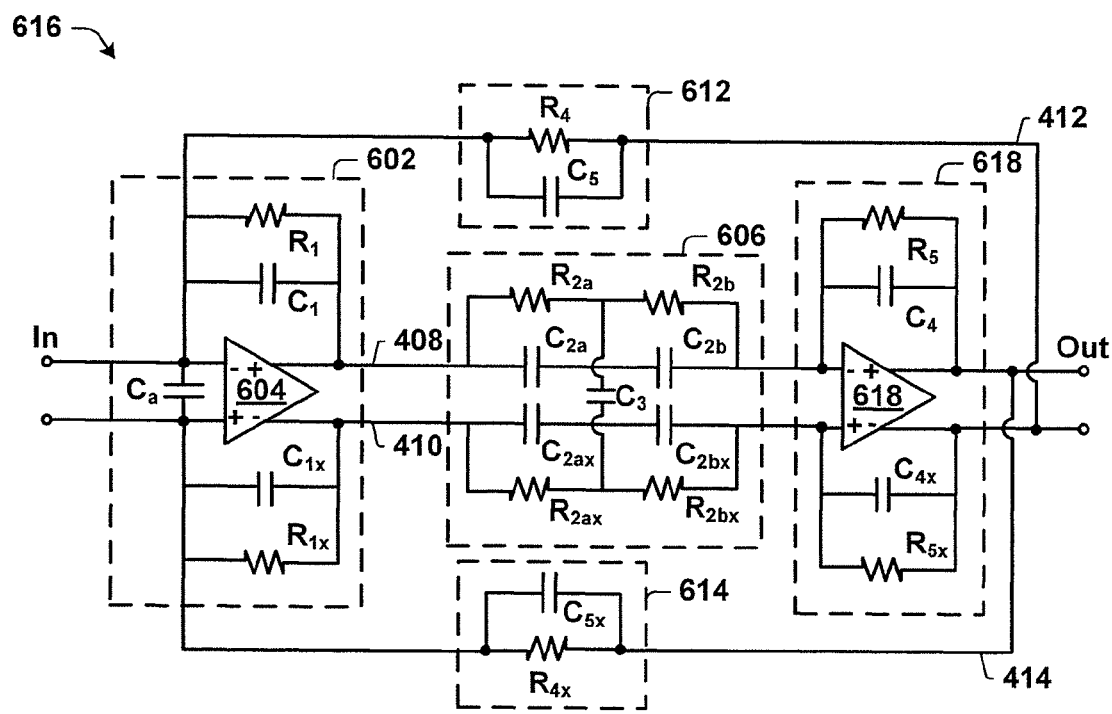
FIG. 6b illustrates a schematic diagram of some alternative embodiments of a disclosed transimpedance amplifier comprising a notch filter element.

FIG. 6b illustrates an alternative embodiment of a schematic diagram of some embodiments of a disclosed transimpedance amplifier 616 comprising a passive notch filter 606.

Transimpedance amplifier 616 has a second filtering element 608 comprising a first order filter element, such that transimpedance amplifier 616 has two first-order RC active filters. In particular, the first order filter element has an operational amplifier 618 and an RC feedback network comprising feedback capacitors $C_4$ and $C_{4x}$ and feedback resistors $R_5$ and $R_{5x}$.

It will be appreciated that the order of elements within the disclosed reception chain may vary in different embodiments. FIGS. 7a-7b illustrates some embodiments of transimpedance amplifier components positioned in different orders. It will be appreciated that the schematic diagrams of FIGS. 7a-7b are not limiting embodiments, but rather are examples of possible ordering of components that may be implemented.

FIG. 7a illustrates a transimpedance amplifier 700 having a second filtering element 608 (shown as an integrator) located upstream of the notch filter element 606 and a first-order active filter 602 located downstream of the notch filter element 606. By interchanging the order of the second filtering element 608 and the first-order active filter 602, relative to the transimpedance amplifier 700 of FIG. 6a, the notch filter element 606 is configured to receive a signal from a second filtering element 608 and to provide a filtered signal to the first order active filter 602.

FIG. 7b illustrates a transimpedance amplifier 702 having input resistive elements, $R_i$ and $R_{ix}$, on the differential paths. The resistors $R_i$, $R_{ix}$, convert the input resistance to a current, such that the transimpedance amplifier 702 acts as a filter whose input is not a current but a voltage. This allows for the transimpedance amplifier 702 to not have to be placed at the output of a mixer (e.g., mixer 112).

FIG. 8a illustrates a schematic diagram of some embodiments of a disclosed transceiver system 800 having a passive, tunable notch filter element 802.

Tunable notch filter element 802 comprises an adjustable stop band frequency. A control unit 804 may be configured to control one or more characteristics of the stop band frequency of the tunable notch filter element 802. By operating control unit 804 to change the stop band of the tunable notch filter element 802, the transceiver system 800 can suppress transmitter blockers over a range of operating modes having different transmitter and/or receiver frequencies. This allows for the transceiver system 800 to be used in multiband phones, which are configured to transmit and/or receive data over a plurality of frequency bands (e.g., it allows the phone to operate over a plurality of mobile communication protocols such as LTE, GSM, CDMA, etc.).

For example, control unit 804 may be configured to adjust tunable notch filter element 802 to attenuate a stop band center frequency centered upon 100 MHz in a first operating mode and a stop band center frequency centered upon 120 MHz in a second operating mode. Control unit 804 may also be configured to adjust the range of the stop band frequency of tunable notch filter element 802. For example, since each operating mode has a different duplex distance between transmitter and receiver, control unit 804 may be configured to adjust the range of the stop band of tunable notch filter element 802 to attenuate a stop band frequency having a range of 40 MHz in a first operating mode (e.g., from 80-120 MHz) and a stop band frequency having a range of 20 MHz in a second operating mode (e.g., from 110-130 MHz).

In some embodiments, control unit 804 is configured to tune the stop band frequency of tunable notch filter element 802 based upon the operating mode of the transmission path 202. For example, in a multiband telephone configured to operate over a plurality of frequency bands, different operating mode will have a different duplex frequency. Based upon the operating mode, control unit 804 is configured to generate a control signal $S_{CTRL}$, which is provided to tunable notch filter element 802. The control signal $S_{CTRL}$ tunes tunable notch filter element 802 to a frequency that corresponds to the transmitter signal frequency, so as to attenuate transmitter blocker signals within the reception path. In some embodiments, the control unit 804 comprises a memory element 806 configured to store one or more predetermined characteristics of the stop band frequency associated with different operating modes. The control unit 804 may be configured to detect an active operating mode, to read data corresponding to the active operating mode from the memory element 806, and to generate the control signal $S_{CTRL}$ based upon the read data.

In other embodiments, control unit 804 may be configured to detect a frequency of a transmitted signal. Based upon the detected frequency of the transmitted signal, control unit 804 is configured to generate a control signal $S_{CTRL}$, which is provided to tunable notch filter element 802. The control signal $S_{CTRL}$ tunes tunable notch filter element 802 to a frequency that corresponds to the transmitter signal frequency, so as to attenuate transmitter blocker signals within the reception path.

Tunable notch filter element 802 may comprise one or more tunable capacitors $C_{2m}'$, $C_3$ and/or tunable resistors $R_{2m}'$. The tunable capacitors $C_{2m}'$, $C_3$ and/or resistors $R_{2m}'$ are tuned by the control signal $S_{CTRL}$ to change one or more characteristics of the stop band frequency of tunable notch filter element 802. In some embodiments, the tunable capacitors and/or resistors may comprise switched capacitors and/or resistors. In other embodiments, the tunable capacitors and/or resistors may comprise other types of variable capacitors and/or resistors.

FIG. 8b illustrates a schematic diagram 808 of an exemplary implementation of a tunable capacitor.

Schematic diagram 808 comprises a plurality of capacitors $C_{1k}, \ldots, C_{nk}$ and a plurality of transmission gates $T_{gate\_1}, \ldots, T_{gate\_n}$. Transmission gates $T_{gate\_1}, \ldots, T_{gate\_n}$ are connected to a wire configured to provide a control word $S_{CTRLn}$. The control word $S_{CTRLn}$ selectively activates transmission gates to provide a variable capacitance between input node IN and output node OUT. For example, when transmission gates $T_{gate\_1}$ and $T_{gate\_2}$ are activated, capacitors $C_{1k}$ and $C_{2k}$ are connected in series with each other resulting in an overall capacitance of $C_{total}=C_{1k}+C_{2k}$. When a transmission gate is deactivated the total capacitance of the variable capacitor $C_k$ is decreased. For example, when transmission gate $T_{gate\_1}$ is activated, capacitors $C_{1k}$ provides an overall capacitance of $C_{total}'=C_{1k}<C_{total}$ Therefore, if the control word $S_{CTRLn}$ turns on transmission gate $T_{gate\_1}$ and $T_{gate\_2}$, capacitor $C_k$ will have an effective capacitance that results in a first stop band frequency. However, if control word $S_{CTRLn}$ turns on transmission gate $T_{gate\_1}$) capacitor $C_k$ will have a smaller effective capacitance that results in a second, different stop band frequency.

In some embodiments, control signal $S_{CTRLn}$ may a digital control word having a plurality of n data bits is provided to a selection circuit 810. Based upon values of the plurality of n data bits in the received control word, the selection circuit 810 sends an activation voltage to selected transmission gates, thereby activating the selected transmission gates and increasing the effective capacitance of capacitor $C_k$.

FIG. 9 is a flow diagram of an exemplary method 900 for suppressing a transmitter interferer signals within differential branches of a reception path.

It will be appreciated that while the method 900 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

At 902 the method operates a transceiver front-end to receive an input signal having a transmitter blocker. The transceiver front-end may receive an input signal comprising an RF input signal at an RF antenna coupled to a differential reception path having first and second differential branches.

At 904 the method operates a first filtering element to filter the received input signal. In some embodiments, the first filtering element comprises a first-order active filter. The first order active filter may operate as a low-pass filter configured to pass low-frequency components of the received signal while attenuating components with frequencies higher than a cutoff frequency.

At 906 the method operates a notch filter element to attenuate a stop band of the received input signal corresponding to a transmitter signal frequency. By attenuating a range of frequencies (i.e., a stop band) that corresponds to a transmitter frequency, frequencies of transmitter blockers within a reception path are suppressed without degrading the signal quality of a received input signal.

At 908 the method operates a second active filtering element to filter the received input signal. In some embodiments, the second active filtering element may comprise an integrator, such that operating the integrator integrates the output of the notch filter element.

At 910 the method may operate a negative feedback path to provide the output of the second active filtering element as a negative feedback signal to an input terminal of the first filtering element, in some embodiments.

At 912 the method may operate a control unit to determine a frequency range of transmitter blockers, in some embodiments. In some embodiments, the frequency range of the transmitter blockers may be determined by measuring the transmitted signal frequency from a transmission path of a transceiver circuit, for example. In other embodiments, the frequency range of the transmitter blockers may be determined by determining an active operating mode and reading data corresponding to the active operating mode from a memory element configured to store frequency ranges associated with an active operating mode.

At 914 the method may operate the control unit to adjust the stop band frequency of the notch filter element based upon the determined frequency range of the transmitter blockers.

FIG. 10 illustrates an example of a mobile communication device 1000, such as a mobile phone handset for example, configured to implement one or more embodiments provided herein. In one configuration, mobile communication device 1000 includes at least one processing unit 1002 and memory 1004. Depending on the exact configuration and type of mobile communication device, memory 1004 may be volatile (such as RAM, for example), non-volatile (such as ROM, flash memory, etc., for example) or some combination of the two. Memory 1004 may be removable and/or non-removable, and may also include, but is not limited to, magnetic storage, optical storage, and the like. In some embodiments, computer readable instructions in the form of software or firmware 1006 to implement one or more embodiments provided herein may be stored in memory 1004. Memory 1004 may also store other computer readable instructions to implement an operating system, an application program, and the like. Computer readable instructions may be loaded in memory 1004 for execution by processing unit 1002, for example. Other peripherals, such as a power supply 1008 (e.g., battery) and a camera 1010 may also be present.

Processing unit 1002 and memory 1004 work in coordinated fashion along with a transceiver 1012 to wirelessly communicate with other devices by way of a wireless communication signal. To facilitate this wireless communication, a wireless antenna 1020 is coupled to transceiver 1012. During wireless communication, transceiver 1012 may use frequency modulation, amplitude modulation, phase modulation, and/or combinations thereof to communicate signals to another wireless device, such as a base station for example. The previously described high resolution phase alignment techniques are often implemented in processing unit 1002 and/or transceiver 1012 (possibly in conjunction with memory 1004 and software/firmware 1006) to facilitate accurate data communication. However, the high resolution phase alignment techniques could also be used in other parts of mobile communication device.

To reduce noise within transceiver 1012, the mobile communication device 1000 also may include a transimpedance amplifier having a first-order filter 1014 and a notch filter element 1016, as previously described. The notch filter element 1016 operates to attenuate a range of frequencies (i.e., a stop band) that corresponds to the frequencies of a transmitter blocker within a reception path, while passing other frequencies. A control unit 1018 may be configured to send control signals to notch filter element 1016 to control one or more characteristics of the stop band of notch filter element 1016. In some embodiments, processing unit 1002 comprises control unit 1018.

To improve a user's interaction with the mobile communication device 1000, the mobile communication device 1000 may also include a number of interfaces that allow the mobile communication device 1000 to exchange information with the external environment. These interfaces may include one or more user interface(s) 1022, and one or more device interface(s) 1024, among others.

If present, user interface 1022 may include any number of user inputs 1026 that allow a user to input information into the mobile communication device 1000, and may also include any number of user outputs 1028 that allow a user to receive information from the mobile communication device 1000. In some mobile phone embodiments, the user inputs 1026 may include an audio input 1030 (e.g., a microphone) and/or a tactile input 1032 (e.g., push buttons and/or a keyboard). In some mobile phone embodiments, the user outputs 1028 may include an audio output 1034 (e.g., a speaker), a visual output 1036 (e.g., an LCD or LED screen), and/or tactile output 1038 (e.g., a vibrating buzzer), among others.

Device interface 1024 allows a device such as camera 1010 to communicate with other electronic devices. Device interface 1024 may include, but is not limited to, a modem, a Network Interface Card (NIC), an integrated network interface, a radio frequency transmitter/receiver, an infrared port, a USB connection, or other interfaces for connecting mobile communication device 1000 to other mobile communication devices. Device connection(s) 1024 may include a wired connection or a wireless connection. Device connection(s) 1024 may transmit and/or receive communication media.

FIG. 11 illustrates one embodiment of a wireless network 1000 over which a mobile communication device (e.g., mobile communication device 1000 in FIG. 10) in accordance with this disclosure may communicate. The wireless network 1100 is divided into a number of cells (e.g., 1102a, 1102b, . . . , 1102d), wherein each cell has one or more base stations (e.g., 1104a, 1104b, . . . , 1104d, respectively). Each base station may be coupled to a carrier's network 1106 (e.g., a packet switched network, or a circuit switched network such as the public switched telephone network (PSTN)) via one or more wirelines 1108.

A mobile device 1110 (e.g., mobile communication device 1000) or other mobile device, having a transceiver comprising a notch filter element, may establish communication with the base station within that cell via one or more of frequency channels used for communication in that cell. The communication between a mobile handset or other mobile device 1110 and a corresponding base station often proceeds in accordance with an established standard communication protocol, such as LTE, GSM, CDMA or others. When a base station establishes communication with a mobile handset or other mobile device, the base station may establish communication with another external device via the carrier's network 1106, which may then route communication though the phone network.

Those skilled in the art will realize that mobile communication devices such as mobile phones may in many instances upload and download computer readable instructions from a network through the base stations. For example, a mobile handset or other mobile device 1110 accessible via network 1106 may store computer readable instructions to implement one or more embodiments provided herein. The mobile handset or other mobile device 1110 may access a network and download a part or all of the computer readable instructions for execution.

The term "computer readable media" as used herein includes computer storage media. Computer storage media includes volatile and nonvolatile, removable and non-removable media implemented in any method or technology for storage of information such as computer readable instructions or other data. Memory (e.g., 1004 in FIG. 10) is an example of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which may be used to store the desired information. The term "computer readable media" may also include communication media. Communication media typically embodies computer readable instructions or other data in a "modulated data signal" such as a carrier wave or other transport component and includes any information delivery media. The term "modulated data signal" may include a signal that has one or more of its characteristics set or changed in such a manner as to encode information in the signal.

Although the disclosure has been shown and described with respect to one or more implementations, equivalent alterations and modifications will occur to others skilled in the art based upon a reading and understanding of this specification and the annexed drawings. Further, it will be appreciated that identifiers such as "first" and "second" do not imply any type of ordering or placement with respect to other elements; but rather "first" and "second" and other similar identifiers are just generic identifiers. In addition, it will be appreciated that the term "coupled" includes direct and indirect coupling. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

What is claimed is:

1. A radio device, comprising:
   a reception path, configured to receive an input signal, comprising a first branch and a second branch configured to conduct an input signal, wherein the reception path comprises:
      a notch filter element configured to receive the input signal and to attenuate the input signal within a frequency band corresponding to a frequency of an interferer signal;
   a first feedback path extending from the second branch at a first output node of the second branch to a first input node of the first branch, wherein the first feedback path is configured to provide a first negative feedback signal to the first branch; and
   a second feedback path extending from the first branch at a second output node of the first branch to a second input node of the second branch, wherein the second feedback path is configured to provide a second negative feedback signal to the second branch.

2. The radio device of claim 1, further comprising:
   a control unit configured to generate a control signal that is provided to the notch filter element, wherein the control signal adjusts one or more characteristics of the notch filter element.

3. The radio device of claim 2, wherein the one or more characteristics of the notch filter element comprise a center frequency of the frequency band and a range of the frequency band.

4. The radio device of claim 1, further comprising:
   a memory element configured to store one or more predetermined characteristics of the notch filter element associated with different operating modes;
   wherein the control unit is configured to determine an active operating mode, to read data corresponding to the active operating mode from the memory element, and to generate the control signal based upon the data.

5. The radio device of claim 1, wherein the reception path further comprises a first filter element connected in series with the notch filter at either an input or an output of the notch filter, wherein the filter element is configured to further filter the input signal.

6. The radio device of claim 5, further comprising:
   one or more switching elements configured to selectively connect or disconnect the notch filter element from the reception path, thereby selectively bypassing the notch filter element.

7. The radio device of claim 5, wherein the reception path further comprises a second filtering element in series with the first filter element and the notch filter is configured to further filter the input signal.

8. The radio device of claim 1, further comprising:
   a control unit configured to detect a frequency of the interferer signal, generate a control signal based upon the detected frequency, provide the control signal to the notch filter element, and adjust one or more characteristics of the notch filter based on the control signal.

9. A mobile handset, comprising:
   a transceiver configured to send and receive a wireless communication signal;
   a reception path having a first branch and a second branch configured to conduct an input signal having an interferer signal, wherein the reception path comprises:
      an active low-pass filter configured to receive the input signal at a first input node in the first branch and a second input node in the second branch, and to filter the input signal;

a tunable, passive notch filter configured to attenuate the input signal within a frequency band corresponding to a frequency of the interferer signal;

a first feedback path extending from the second branch at a first output node thereof to the first input node, wherein the first feedback path is configured to provide a first negative feedback signal to the first branch; and a second feedback path extending from the first branch at a second output node thereof to the second input node, wherein the second feedback path is configured to provide a second negative feedback signal to the second branch.

10. The mobile handset of claim 9, wherein the first and second branches of the tunable, passive notch filter respectively comprise a capacitive element connected in parallel to a resistive element between an input of the tunable, passive notch filter configured to receive the input signal from the first-order active low-pass filter and an output of the tunable, passive notch filter.

11. The mobile handset of claim 9, further comprising:
a control unit configured to generate a control signal that is provided to the tunable, passive notch filter, wherein the control signal adjusts one or more characteristics of the tunable, passive notch filter.

12. The mobile handset of claim 11, wherein the one or more characteristics of the tunable, passive notch filter comprise a center frequency of the frequency band and a range of the frequency band.

13. The mobile handset of claim 11, wherein the control unit is configured to detect a frequency of the interferer signal and to generate the control signal based upon the detected frequency.

14. The mobile handset of claim 11, wherein the control unit is further configured to generate a switching control signal that is provided to one or more switching elements configured to selectively connect or disconnect the tunable, passive notch filter from the reception path.

15. The mobile handset of claim 11, wherein the control signal comprises a digital control word having a plurality of data bits.

* * * * *